United States Patent [19]

Rinerson

[11] Patent Number: 4,654,825
[45] Date of Patent: Mar. 31, 1987

[54] E² PROM MEMORY CELL
[75] Inventor: Darrell D. Rinerson, Santa Cruz, Calif.
[73] Assignee: Advanced Micro Devices, Inc., Sunnyvale, Calif.
[21] Appl. No.: 568,668
[22] Filed: Jan. 6, 1984
[51] Int. Cl.⁴ ............................................. G11C 11/40
[52] U.S. Cl. ................................. 365/185; 357/23.5; 365/182
[58] Field of Search ................ 365/185, 182, 104, 72; 357/23.5, 23.6

[56] References Cited

U.S. PATENT DOCUMENTS

| | | |
|---|---|---|
| 4,203,158 | 5/1980 | Frohman-Bentchkdrski et al. ........................................ 357/23.5 |
| 4,266,283 | 5/1981 | Perlegos et al. ..................... 365/104 |
| 4,317,272 | 3/1981 | Kuo et al. .......................... 357/23.5 |
| 4,342,099 | 7/1982 | Kuo ................................... 357/23.5 |
| 4,366,555 | 12/1982 | Hu ..................................... 365/185 |
| 4,379,343 | 4/1983 | Moyer ................................ 365/185 |
| 4,477,825 | 10/1984 | Yaron et al. ........................ 365/185 |

OTHER PUBLICATIONS

Scherpenberg et al., "Asynchronous Circuits Accelerate Access to 256—K Read—Only Memory", Electronics, vol. 55, No. 11, 6—2—82, pp. 141-145.
Mehrotra, et al., "Oxynitride Film Yields Long—Lived 64—K EE—PROM Cells", *Electronics*, pp. 118-121, Dec. 1, 1983.
Gupta, et al., "A 5V—Only 16K EEPROM Utilizing Oxynitride Dielectrics and EPROM Redundancy", IEEE Int. Solid—State Circuits Conference, pp. 184-185, Feb. 11, 1982.

*Primary Examiner*—Terrell W. Fears
*Attorney, Agent, or Firm*—Patrick T. King; Eugene H. Valet; Gerald B. Rosenberg

[57] ABSTRACT

A five volt only E² PROM cell including metal bit read and bit ground column lines and polysilicon word select and program row lines. An interconnected word select and stacked gate transistor serially connect the bit read and bit ground lines. The cell also includes a tunneling structure, disposed below the program row line, for charging or uncharging a floating polysilicon gate in the stacked gate transistor. The bit ground line is disconnected from ground during the charging and uncharging operations.

16 Claims, 5 Drawing Figures

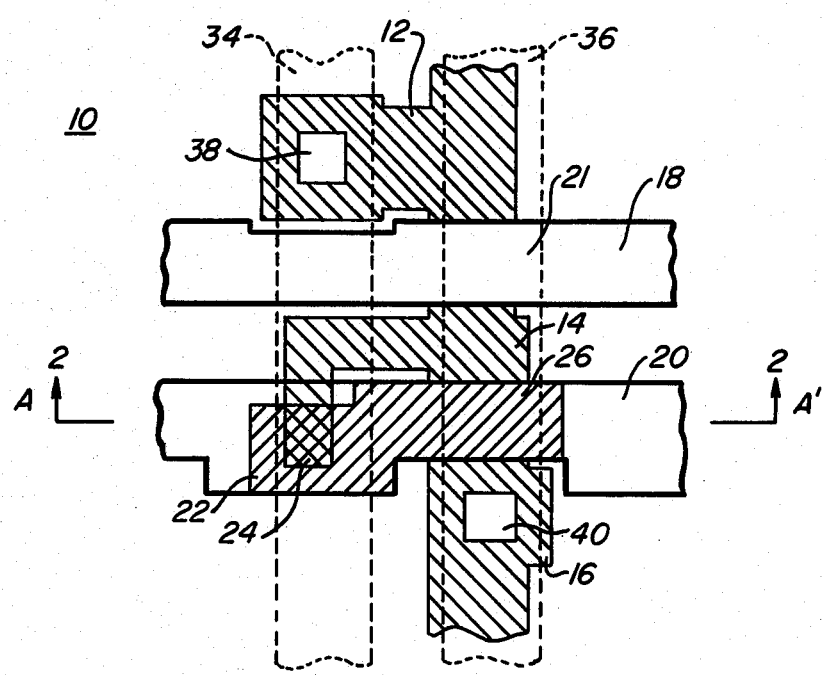
FIG._1.
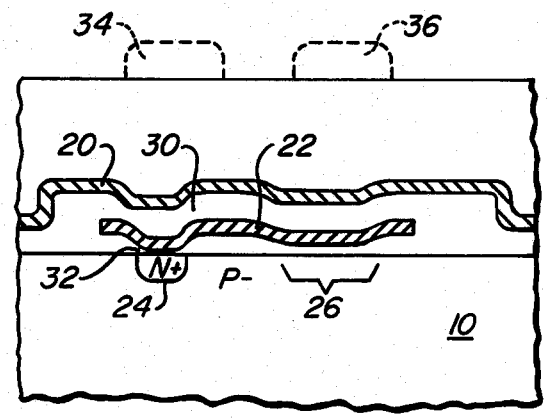
FIG._2.

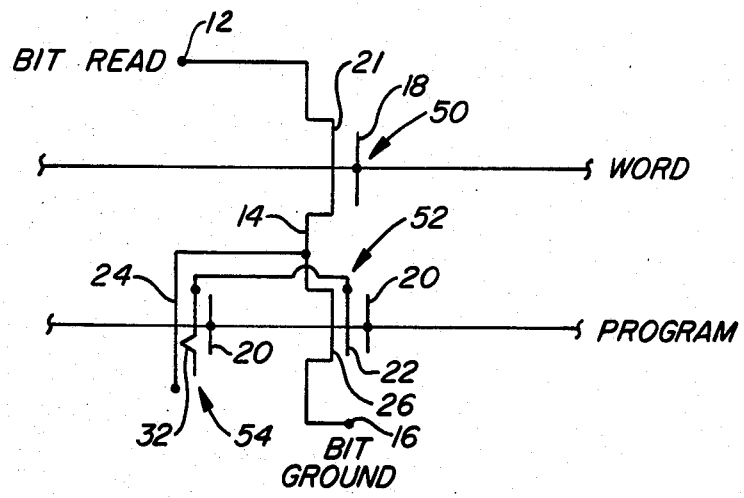
FIG._3.

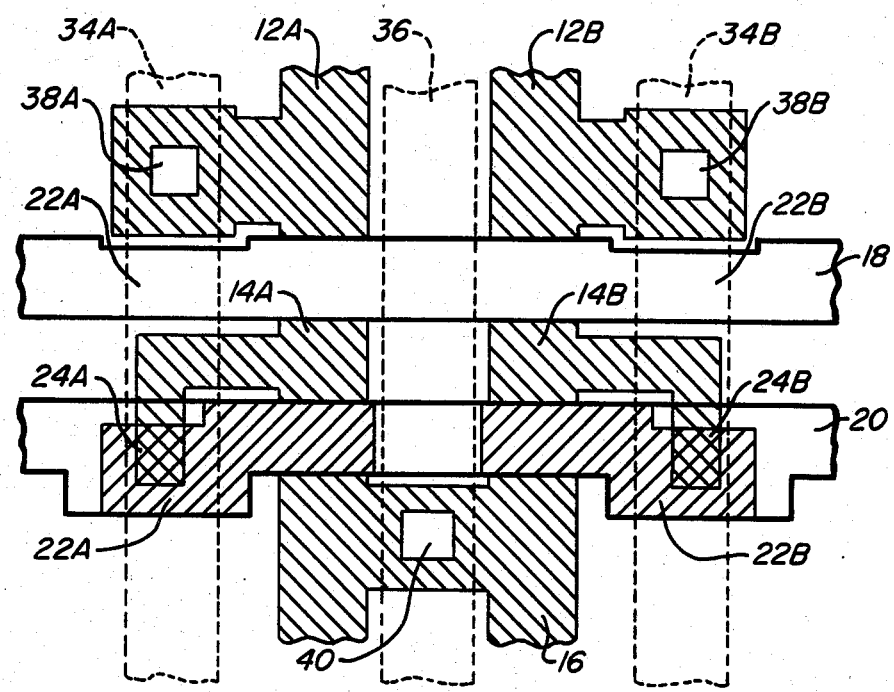
FIG._4.
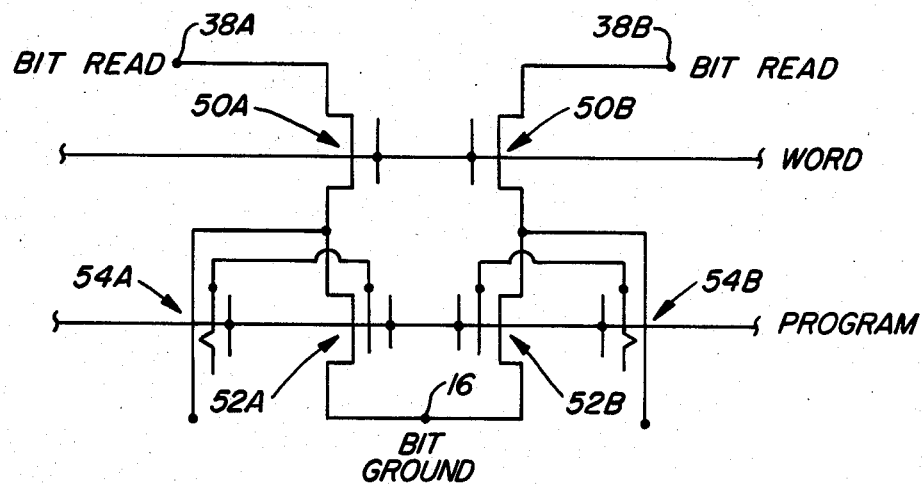
FIG._5.

E² PROM MEMORY CELL

BACKGROUND OF THE INVENTION

The invention relates to an electrically erasable programmable read only memory (E²PROM) formed on a semiconductor substrate.

E²PROMs are integrated circuits and are typically manufactured in NMOS technology. Most of the active devices of an E²PROM are NMOS transistors formed by heavily doped N-type (N+) regions separated by a lightly doped P-type (P−) region, all in a semiconductor substrate. The P− region forms the channel between the N+ regions. The conductivity between the N+ regions through the channel is controlled by electrical signals on a gate electrode in close proximity over, but electronically isolated from, the channel.

E²PROMs are organized in a rectangular array of memory cells formed in a semiconductor substrate with each cell in the array storing a single bit of information. The cells are addressed by their row and column locations in the array. Each cell is a circuit including transistors coupling a bit line to ground. The transistors are controlled by signals on word and program control lines which supply predetermined voltages to the gates of the transistors. The transistor controlled by the program control line is a stacked gate transistor including a floating polysilicon gate below a control gate. The stacked gate transistor will conduct if the floating gate is uncharged and will not conduct if the floating gate is charged.

A given cell in the array is read by the following procedure. First the bit line connected to the cell is biased positively while the word and program lines intersecting the cell are biased to predetermined voltages. A current sensing amplifier provides a digital output corresponding to the flow of current from the bit line through the cell to ground. Current will flow if the floating gate is uncharged (erased), which is the logic 1 state, and will not flow if the cell is charged (programmed), which is the logic 0 state.

The floating gate in a given cell is charged (programmed) by electrons tunneling through a special dielectric region separating an N+ region in the substrate, which is grounded, from the floating polysilicon gate. This tunneling is induced by biasing the control gate to a high voltage (about +20 volts), which brings the floating gate to a high voltage due to capacitive coupling between the control gate and the floating gate. The floating gate is discharged (erased) by raising the N+ region to a high voltage and grounding the control gate.

An array of E²PROM memory cells includes an N+ region in the substrate interconnecting a column of cells to ground. During the program/erase operations, DC current is drawn through the N+ region. Because of this current an external high voltage supply is required for the program/erase operations. In many applications, only a single, low voltage power supply, typically 5 volts, is available, so that the above-described E²PROM cell is of limited utility. Additionally, the N+ diffusion region interconnecting the column of cells prevents the cells from being completely electrically isolated from each other and causes disturbance of neighboring cells during a program/erase operation for a given cell.

Recently, E²PROM cells interconnected by a metal bit read line instead of a common N+ diffusion region have been developed. Each cell includes an isolated N+ region interconnected with another metal line, a bit write line, instead of the common N+ diffusion of the above-described cells. By allowing the metal bit read line to float electrically and using the metal bit write line to apply position voltages to the N+ regions of the memory cell, the floating gate is charged and discharged. Little DC current is drawn. This approach allows the use of on-chip circuitry to generate the high voltage required for the program/erase operations and allows the cell to function with only an external five volt supply interconnected thereto. While this cell is advantageous over other prior art memory cells, its area on a semiconductor substrate has not been minimized.

SUMMARY OF THE INVENTION

The present invention provides a five volt only E²-PROM cell that is less metal dense than the five volt only memory cells in the prior art. The cell is suitable for use in a rectangular array.

The cell includes parallel bit read and bit ground column lines interconnected by an MOS transistor and a stacked gate transistor connected in series. Word and program row lines running perpendicular to the column lines traverse the cell and provide voltage bias levels to the transistors in the cell. The cell also includes a tunneling structure, disposed beneath the program line, for charging or discharging the floating gate of the stacked gate transistor. In a preferred embodiment the bit read and bit ground lines are metal lines formed over the surface of the cell.

The transistors in the cell are formed by diffusing isolated N+ regions into the section of the P− substrate region bounded by the bit read and bit ground lines. The N+ regions are separated by channels which are sections of the P− substrate. These N+ regions form the source and drain of an MOS transistor; however, a particular region may function as a source or a drain, depending on the bias state applied to the different lines interconnected with the cell. Thus, the source/drain regions will be referred to hereinafter as "terminals."

A word select transistor is formed by a bit read terminal partly disposed under the bit read line and electrically connected thereto and a central terminal isolated from both the bit read and bit ground lines. The bit read terminal and central terminal are separated by a first P− channel which is gated by the word line. Thus when the word line is biased to a predetermined positive voltage the word select transistor is turned on and conducts.

The stacked gate transistor includes the central terminal and a bit ground terminal partially disposed below the bit ground line and electrically connected thereto. These terminals are separated by a second P− channel. The stacked gate transistor includes a floating polysilicon gate and a control gate which is the program line. When the program line is biased to a sensing voltage, the stacked gate transistor will conduct if the floating gate is uncharged, and will not conduct if the floating gate is charged. Thus, current will flow between the bit read and bit ground line if the floating gate is uncharged (logic 1) and will not flow if the floating gate is charged (logic 0).

The central terminal includes a tunneling extension region which is disposed below the program line and a section of the floating polysilicon gate of the stacked gate transistor. The tunneling extension and the floating polysilicon gate are separated by a very thin oxide layer which permits the tunneling of electrons between the tunneling extension and the floating polysilicon gate under appropriate conditions.

The floating gate is charged by the following procedure. The bit read line is grounded and the word line is brought to +20 volts to form a strongly conducting channel between the bit read terminal and the central terminal, thereby assuring that the central terminal and the tunneling extension are grounded. The bit ground line is allowed to float. Thus, the tunneling extending of the N+ central terminal is quickly charged to the full twenty volts without drawing substantial DC current. Similarly, during the discharge operation the word line is charged to +20 volts while the program and read lines are grounded. Again, the bit ground line is allowed to float so that no current can be drawn during the erase operation.

A particular advantage to the invention is the inherent symmetry of the cell which allows two cells to be symmetrically disposed about a bit ground line with a common connection thereto. In this configuration a bit ground line has a parallel bit read line disposed equidistantly on either side of the bit ground line. The components of the cell pair are symmetrically arranged about either side of the bit ground line. An A cell, between the first bit read line and the common bit ground line, interconnects the first bit read line to the bit ground line while the corresponding B cell, between the second bit read line and the common ground line, connects the second bit read line to the common bit ground line. This configuration reduces the metal density of the cell by requiring only one and a half metal lines per cell instead of the two required by prior art five volt only E²PROM cells. Thus the cell provided by the present invention is less metal dense than standard five volt only E²PROM cells. It is desirable that memory cells be scaleable so that the size of the cell may be correspondingly reduced by advances in processing techniques. Size reduction is often limited by the metal density of a given cell due to the fact that the width of a metal line may not be reduced below a certain minimum. Thus, by reducing the metal density of a five volt only E²PROM cell, the present invention provides for a greater reduction in size of the cell than heretofore possible.

BRIEF DESCRIPTION OF THE DRAWINGS

FIG. 1 is a top view of an E²PROM cell which is an embodiment of the present invention.

FIG. 2 is a cross-sectional view of the embodiment depicted in FIG. 1 taken along line A—A'.

FIG. 3 is a circuit diagram corresponding to the circuit elements defined in FIG. 1.

FIG. 4 is a top view of a symmetric E²PROM cell pair which is an alternative embodiment of the present invention.

FIG. 5 is a circuit diagram corresponding to the circuit elements defined in FIG. 4.

DETAILED DESCRIPTION OF THE PREFERRED EMBODIMENTS

The present invention is a five-volt only E²PROM cell which is configured so that a pair of cells may be symmetrically disposed about a common bit ground line with a common electrical connection thereto.

In the drawings, identical reference numerals indicate like or corresponding parts throughout the circuit views. In FIG. 1 a top plan view of a single E²PROM cell is depicted. The cell is formed at the surface of a P− substrate 10. The cell includes a bit read N+ region 12, a central N+ region 14, and a bit ground N+ region 16. These N+ isolated regions are diffused into the P− substrate 10.

Separating these N+ regions from a top view are polysilicon word select and program lines 18 and 20, which extend horizontally across the cell. The region of the P− substrate 10 disposed below the word select line 18 forms a first channel 21 between the bit read and central isolated regions 12 and 14. The word select line 18 is insulated from the first channel 21 by an oxide layer (not shown in FIG. 1). The bit read N+ isolated region 12, first channel 21, central isolated region 14, oxide region, and word select line 18 form a word select NMOS transistor with the N+ isolated regions forming the source and drain of the transistor and the word select line 18 forming the control gate. In operation, the N+ regions 12 and 14 may function as either the source or drain of the transistor; therefore, the isolated regions are referred hereinafter as terminals.

Disposed below the program line 20 is a floating polysilicon gate 22 shown as a shaded area of program line 20. The gate 22 is described in more detail below with reference to FIG. 2. The central N+ region 14 includes a tunneling extension portion 24 which is disposed below the floating polysilicon gate 22. As may be seen in the plan view of FIG. 1, the tunneling extension portion 24 is substantially smaller in area than the floating gate. The region of the P− substrate 10 below the program line 20 and between the central and bit ground N+ regions forms a second MOS transistor channel region 26.

FIG. 2 is a cross-sectional view of the E²PROM cell depicted in FIG. 1, taken along the line A—A' of FIG. 1. In FIG. 2 the floating polysilicon gate 22 is completely enclosed by an oxide layer 30 that insulates the floating polysilicon gate 22 from the P− substrate 10 and the program line 20. Note that the section of the polysilicon gate 22 disposed over the tunneling extension portion 24 is separated by a very thin layer of oxide termed the tunneling dielectric section 32. The tunneling dielectric section 32, typically about 100 Angstroms thick, allows electrons to tunnel between the N+ tunneling extension portion 24 and the floating polysilicon gate 22 when the tunneling extension 24 and the program line 20 are appropriately biased.

Referring now back to FIG. 1, vertical bit read and bit ground metal conductive lines 34 and 36 are disposed above the cell and insulated therefrom by an oxide layer (not shown). The bit read line 34 contacts the bit read N+ region 12 through a via 38 formed in the oxide region while the bit ground line 36 contacts the bit ground N+ isolated region 16 through a second via 40.

FIG. 3 is circuit diagram corresponding to the circuit elements defined by the structures depicted in FIG. 1. A word select NMOS transistor 50 includes a bit read terminal 12, a P− channel 21, a central terminal 14, and a control gate 18. A stacked gate transistor 52 includes the first central terminal 14, a P− channel 26, a bit ground terminal 16, a floating gate 22, and a program control gate 20. The word select transistor 50 and stacked gate transistor 52 form a series circuit between the bit read and bit ground lines 34 and 36. The tunneling structure 54 includes the tunneling extension 24, the tunneling dielectric region 32, the floating gate 22 and a program control gate 20.

Table 1 is a state table setting forth the voltage states for the word, program, bit, read, and bit ground lines during the erase, program, and read operations.

TABLE 1

|  | Word Select | Program | Bit Read | Bit Ground |
|---|---|---|---|---|
| Erase | +20 | 0 | +20 | Open |
| Program | +20 | +20 | 0 | Open |
| Read | +5 | +2.5 | +1.0 | 0 |

The erase, program, bit read, and bit write operation for the cell will now be described with reference to Table 1 and FIG. 3. During the erase operation both the word line 18 and bit read line 12 are set at +20 volts. The high voltage on the word line minimizes the resistance of the first region 21 and assures that the tunneling extension of the central N+ region 14 is raised to a full 20 volts. The bit ground line is open so that the bit ground N+ region 16 is floating with respect to the voltage supply, thereby allowing no current to flow through the bit ground line 36. The tunneling extension may thus be fully raised to the 20-volt level to erase the floating gate while drawing an insubstantial amount of DC current, thereby facilitating the use of an on-chip 20-volt power supply. The program gate 20 disposed over the floating polysilicon gate 22 is biased at zero volts. Thus, electrons in the polysilicon gate 22 are induced to tunnel through the tunneling dielectric 32 into the tunneling extension 24 and the floating polysilicon gate 22 is discharged. If the polysilicon gate 22 were uncharged before commencing the erase operation, then it would remain in the uncharged condition.

During the program operation the bit read line 12 is grounded at zero volts and the bit word line 18 is again charged to twenty volts to reduce the resistance of the first channel region 21 and assure that the tunneling extension 24 is grounded. The program line 20 is biased to twenty volts, thereby biasing the floating gate 22 to a high voltage (approximately +15 volts) due to the capacitive coupling between the word program control gate 20 and the floating polysilicon gate 22. Electrons tunnel from the tunneling extension through the tunneling dielectric region 32 into the polysilicon gate 22.

During a read operation the bit read line 34 is biased to +5 volts and the bit ground line 36 is grounded. The word select line 18 is biased so that the word select transistor 50 is on and conducts while the program line 20 is biased so that the stacked gate transistor 52 conducts if the floating polysilicon gate 22 is uncharged and does not conduct if the floating polysilicon gate is charged. Thus, current will flow from the bit read line 34 to the bit ground line 36 if the polysilicon gate 22 is uncharged (logic 1 state) and will not flow if the polysilicon gate 22 is charged (logic 0 state).

During a write operation the cell is first programmed so that the floating polysilicon gate 22 is charged and the cell is in a logic 0 state. If a logic 1 is to be stored in the cell, then the floating polysilicon gate 22 is programmed and the floating polysilicon gate is discharged.

The cell is formed by diffusing the bit read, central, and bit ground N+ regions into the P− substrate 10 by standard photolithographic processes. An oxide layer is then deposited over the surface of the P− substrate and the N+ regions. This oxide layer includes a thin dielectric tunneling region 32 formed by methods well-known in the art. The vias, word select and program polysilicon lines 18, 20, metal bit read and bit ground lines, 34, 36 and insulating oxide layers 30 are also formed by standard methods well known in the art.

Referring now to FIG. 4, an alternative embodiment of the invention is depicted with two identical E²PROM cells symmetrically disposed on either side of a bit ground line 36. In FIG. 4, bit ground line 36 has first and second bit read lines 34A and 34B disposed on either side where the first and second bit read lines 34A and 34B are positioned equidistantly from the center line 50 of the bit ground line 36. The region bounded by the first bit line 34A and the center line 50 is termed the A region with the cell formed in the A region termed the A cell, while the region bounded by the center line 50 and the second bit line 34B is termed the B region with the cell formed in the B region termed the B cell. A bit ground N+ isolated region 16 forms the common bit ground terminal for both cells. The remaining elements of both the A and B cells are identical to the elements described above with reference to FIG. 1. The elements in the A and B cells correspond to the elements in FIG. 1 and are labeled by the same numerals of FIG. 1 with an A or a B suffix denoting corresponding elements in respective cells. In operation, the function of the A or B cell is identical to the function of the cells depicted in FIG. 1 with the first bit read line 34A being activated when cell A is in operation and the second bit read line 34B being activated when cell B is in operation.

FIG. 5 is a circuit diagram depicting the circuit elements formed by the structure depicted in FIG. 4. Note that an A series circuit is formed by the word select transistor 50A and stack gate transistor 52A connecting the first bit read line 34A to bit ground line 36. Similarly, a B series circuit is formed by the word select transistor 50B and the stack gate transistor 52B connecting the second bit read line 34B to the bit ground line 36. Each stack gate transistor 52A, B has an associated tunneling structure 54A, B connected thereto and each series circuit functions exactly as the circuit described with a reference to FIG. 3.

The configuration depicted in FIG. 4 includes only one and one-half metal lines per E²PROM cell as opposed to standard five volt only E²PROM cells which require two metal lines per cell. This decrease in metal density increases the scaleability of the cell thereby facilitating a grater reduction in size of the present cell than present five volt only E²PROM cells.

Although the foregoing invention has been described with respect to particular embodiments, these embodiments are not intended to limit the invention, but rather to clarify and explain it. The scope of the invention is to be determined from the appended claims.

What is claimed is:

1. An E²PROM memory cell formed at the surface of a semiconductor substrate, said cell comprising:
   a bit read N+ region disposed in said substrate;
   a central N+ region disposed in said substrate with said central N+ region including a tunneling extension region;
   a first P− channel separating said bit read and said central N+ regions;
   a first oxide layer over said first channel;
   a word control polysilicon gate disposed over said first channel, with said first oxide layer insulating said first polysilicon gate from said first channel where said bit read and central N+ regions, said first P− channel, said first oxide layer and said polysilicon gate form a word select NMOS transistor;

a bit ground N+ region in said substrate;

a second P— channel separating said central and bit ground N+ regions;

a second oxide layer over said second channel and said tunneling extension region of said central N+ isolated region, with said second oxide layer including a tunneling portion disposed over said tunneling extension region;

a floating polysilicon gate disposed on said second oxide layer and over said second channel and said tunneling extension region;

a third oxide layer covering said floating polysilicon gate;

a program control polysilicon gate over said floating polysilicon gate, said third oxide layer insulating said third polysilicon gate from said floating polysilicon gate, wherein said central and bit ground N+ regions, said second channel, and said second and third oxide layers, and said floating and third polysilicon gates form a stacked gate transistor and wherein said tunneling extension region, said tunneling portion, and sections of said floating polysilicon gate, said third oxide layer, and said third polysilicon gate disposed over said tunneling section forming a tunneling structure;

bit read means for connecting said bit read N+ region to a first voltage source;

bit ground means for selectively connecting said bit ground N+ region to a second voltage source;

whereby electrons tunnel between said tunneling extension of said central N+ region and said floating gate when predetermined biasing voltages are applied to said first and third polysilicon gates and said bit read and bit ground N+ regions.

2. The E$^2$PROM cell recited in claim 1 wherein:

said means for connecting said bit read N+ region is a metal bit read line insulated from said bit read N+ region by a fourth oxide layer and connected with said bit read N+ region through a via formed in said fourth oxide layer; and said means for connecting said bit ground N+ region is a metal bit ground line insulated from said bit ground region by a fifth oxide layer and connected with said bit ground region through a via formed in said fifth oxide layer, said bit read and bit ground lines being substantially parallel and with said bit read, central and bit ground N+ regions disposed substantially under and between said bit read and said bit ground lines.

3. The E$^2$PROM memory cell defined in claim 2 wherein:

said word gate is a polysilicon word line disposed over the surface of said substrate; and said program gate is a polysilicon program line disposed over the surface of said substrate with said polysilicon word line and said polysilicon program oriented substantially perpendicular to said bit read and bit ground lines.

4. An E$^2$PROM memory cell formed in a P— region on the surface of a semiconductor substrate, said cell comprising:

a bit read line disposed over the surface of said P— region;

a bit ground line disposed over the surface of said P— region;

an NMOS transistor, disposed on said P— region, having a word select gate and also having bit read and central terminals with said bit read terminal connected to said bit read line;

a stacked gate MOS transistor, having a floating polysilicon gate disposed under a program gate and also having a first terminal and a bit ground terminal defining a channel region of thereinbetween, with said bit ground terminal of said stacked gate transistor being connected to said bit ground line and said first terminal being said central terminal; and a tunneling structure for charging and discharging said floating polysilicon gate, said tunneling structure including a tunneling portion of said central terminal spaced apart from said channel region of said stacked gate MOS transistor and the remainder of said central terminals by a tunneling extension portion of said central terminal underlying respective portions of said floating polysilicon gate and said program gate.

5. The E$^2$PROM memory cell defined in claim 4 wherein said tunneling portion is disposed below said floating polysilicon gate with the area of said tunneling portion being substantially smaller that the area of said floating polysilicon gate.

6. The E$^2$PROM memory cell defined in claim 5 wherein said tunneling structure further comprises:

a tunneling dielectric disposed on the surface of said tunneling portion for allowing electrons to tunnel between said tunneling portion and said floating polysilicon gate when said tunneling portion and said program gates are biased to predetermined voltage levels.

7. The E$^2$PROM memory cell defined in claim 6 wherein:

said word gate is a polysilicon word select line disposed over the surface of said P— region; and said program gate is a polysilicon program line disposed over the surface of said P— region with said polysilicon word line and said polysilicon program line oriented substantially perpendicular to said bit read and bit ground lines.

8. An E$^2$PROM memory system formed on a P— semiconductor substrate, said system comprising:

a substantially straight metal bit ground line disposed over said P— substrate and selectably couplable to a ground reference potential a line equidistant from the edges of said bit ground line defining the center line of said bit ground line;

first and second substantially straight metal bit read lines disposed over said P— substrate and positioned on opposite sides of said bit ground line substantially equidistant therefrom and parallel thereto, with a section of the P— substrate bounded by said first bit read line and a center line of said bit ground line defining an A region and with the corresponding section of the P— substrate bounded by said second bit read line and the center line of said bit ground line defining a B region;

a polysilicon word select line;

a polysilicon program line with said word select and program lines oriented perpendicularly to said bit ground line;

(A) and (B) E$^2$PROM cells disposed in said A and B regions respectively with corresponding elements in said (A) and (B) cells being symmetrically disposed about said bit ground line where corresponding circuit elements in said (A) and (B) cells are denoted (A) and (B) elements, respectively, with said (A) cell including an (A) NMOS word select transistor having an (A) word gate and also having bit read and central terminals with said bit read terminal connected to said first bit read line, an (A) stacked gate MOS transistor, having an (A) floating polysilicon gate disposed below an (A) program gate, having a first terminal being said central terminal of said (A) word select transistor, and having a bit ground terminal with said bit ground terminal of said (A) stacked gate transistor connected to said bit ground line, and an (A) tunneling structure for charging and discharging said (A) floating polysilicon gate of said (A) stacked gate transistor; and with said (B) cell including a (B) NMOS word select transistor having a (B) word gate and also having bit read and central terminals with said bit read terminal connected to said second bit read line, a (B) stacked gate MOS transistor, having a (B) floating polysilicon gate disposed below a (B) program gate, having a first terminal being said central terminal of said (B) word select transistor and having a bit ground terminal with said bit ground terminal of said stacked gate transistor connected to said bit ground line, and a (B) tunneling structure for charging and discharging said (B) floating polysilicon gate of said (B) stacked gate transistor with said (A) and (B) floating polysilicon gates being electrically isolated.

9. The E$^2$PROM memory system defined in claim 8 wherein said A and B cells further comprise:

a bit read N+ region symmetrically disposed about the center line of said bit ground line and electrically connected to said bit ground line, with said bit ground N+ region being said bit ground terminal for said A and B stack gate transistors.

10. The E$^2$PROM system defined in claim 9 wherein said (A) central terminal comprises:

a central N+ region having a tunneling extension, said tunneling section being disposed below said (A) floating gate with the area of said tunneling extension being substantially smaller than the area of said A floating gate.

11. The E$^2$PROM system defined in claim 10 wherein said A tunneling structure comprises:

said (A) tunneling section of said A central N+ region;

a section of said (A) floating gate having said tunneling section disposed thereunder; and an (A) tunneling dielectric disposed on the surface of said tunneling section for allowing electrons to tunnel between said (A) tunneling section and said (A) floating gate when said (A) tunneling section and said (A) program gates are biased to predetermined voltage levels.

12. The E$^2$PROM system defined in claim 11 wherein:

said word gate is said polysilicon word line; and
said program gate is said polysilicon program line.

13. An electrically erasable and programmable semiconductor memory cell comprising:

(a) a semiconductor substrate of a first conductivity type and having a major surface;

(b) first and second regions of a second conductivity type disposed within and at said major surface of said substrate, said first and second regions being spaced apart from one another at said major surface of said substrate by a first channel portion of said substrate, said second region including an extension region and a tunneling terminal region, said tunneling terminal region being intercoupled by and spaced apart from the remainder of said second region by said extension region;

(d) a third region of said second conductivity type disposed within and at said major surface of said substrate, said second and third regions being spaced apart from one another at said major surface of said substrate by a second channel portion of said substrate;

(e) a first gate electrode overlying said first channel portion of said major surface of said substrate;

(f) a floating gate electrode overlying said second channel portion of said major surface of said substrate and said tunneling terminal region of said second region;

(g) a thin oxide layer interposed between said tunneling terminal region and the immediately corresponding portion of said floating gate electrode, the thickness of said thin oxide layer being such to allow electron tunneling between said tunneling terminal region and said floating gate electrode; and (h) a second gate electrode overlying said second channel portion of said major surface of said substrate, said tunneling terminal region of said second region and the respectively corresponding portions of said floating gate electrode.

14. The memory cell of claim 13 further comprising:

(a) a first bit line overlying and electrically coupled to said first region; and (b) a second bit line overlying and electrically coupled to said third region, said first and second bit lines being substantially parallel to said major surface of said substrate.

15. The memory cell of claim 14 wherein said first and second gate electrodes include, respectively, first and second word lines, said first and second word lines being substantially parallel to one another and provided in a plane generally parallel to said major surface of said substrate, said first and second word lines being orthogonally oriented with respect to said first and second bit lines.

16. The memory cell of claim 15 wherein the most distant opposing edges of said first and second bit lines and said first and second word lines, respectively, define a substantially rectangular area plane parallel to said major surface of said substrate and wherein said extension region and said tunneling terminal region of said second region lie within the area bounded by said rectangular area as perpendicularly projected onto of said major surface of said substrate.

* * * * *